(12) United States Patent
Gu et al.

(10) Patent No.: US 11,991,894 B2
(45) Date of Patent: May 21, 2024

(54) FLEXIBLE DISPLAY DEVICE AND METHOD FOR PREPARING THE SAME

(71) Applicant: BOE Technology Group Co., Ltd., Beijing (CN)

(72) Inventors: Penghao Gu, Beijing (CN); Chunyan Xie, Beijing (CN); Lingzhi Qian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 429 days.

(21) Appl. No.: 17/419,037

(22) PCT Filed: Dec. 29, 2020

(86) PCT No.: PCT/CN2020/140850
§ 371 (c)(1),
(2) Date: Jun. 28, 2021

(87) PCT Pub. No.: WO2021/136270
PCT Pub. Date: Jul. 8, 2021

(65) Prior Publication Data
US 2022/0376205 A1   Nov. 24, 2022

(30) Foreign Application Priority Data
Jan. 3, 2020   (CN) .......................... 202010013479.8

(51) Int. Cl.
*H10K 50/84*  (2023.01)
*H05K 1/02*   (2006.01)
(Continued)

(52) U.S. Cl.
CPC ......... *H10K 50/8426* (2023.02); *H05K 1/028* (2013.01); *H10K 50/841* (2023.02);
(Continued)

(58) Field of Classification Search
CPC ............... H10K 50/8426; H10K 71/00; H10K 2102/311; H10K 50/841; H10K 77/111;
(Continued)

(56) References Cited

U.S. PATENT DOCUMENTS 9,746,765 B2   8/2017   Choi et al.
10,608,194 B2  3/2020   Dang et al.
(Continued)

FOREIGN PATENT DOCUMENTS

CN   104630873 A   5/2015
CN   206322700 U   7/2017
(Continued)

OTHER PUBLICATIONS

English Translation CN110192291, Boe Technology Group; Published Aug. 30, 2019 (Year: 2019).*
(Continued)

*Primary Examiner* — Steven T Sawyer
(74) *Attorney, Agent, or Firm* — WHDA, LLP

(57) ABSTRACT

The present disclosure provides a flexible display device and a preparation method thereof. The flexible display device has different base materials and adhesives for the back supporting film at the bonding region and the non-bonding region, so that it can satisfy the requirements for AOI and bending resistance respectively, and can be advantageous for a patterning step for base material including subtractive manufacturing.

10 Claims, 2 Drawing Sheets

(51) Int. Cl.
*H10K 50/842* (2023.01)
*H10K 71/00* (2023.01)
*H10K 77/10* (2023.01)
*H10K 102/00* (2023.01)

(52) U.S. Cl.
CPC ............ *H10K 71/00* (2023.02); *H10K 77/111* (2023.02); *H10K 2102/311* (2023.02)

(58) Field of Classification Search
CPC ........ H10K 59/10; H10K 50/84; H10K 59/50; Y02E 10/549; Y02P 70/50; C09J 7/255; C09J 7/25; C09J 7/28; C09J 2433/00; C09J 2467/006; C09J 2479/086; G02F 1/133305; H05K 1/028
See application file for complete search history.

(56) References Cited

U.S. PATENT DOCUMENTS

| | | |
|---|---|---|
| 11,101,453 B2 | 8/2021 | Jiang |
| 11,189,606 B2 | 11/2021 | Shin et al. |
| 2013/0038822 A1* | 2/2013 | Aono .......................... C08J 3/14 528/323 |
| 2015/0132598 A1 | 5/2015 | Choi et al. |
| 2019/0319202 A1 | 10/2019 | Dang et al. |
| 2019/0357366 A1* | 11/2019 | Choi ...................... G06F 1/1652 |
| 2020/0004077 A1* | 1/2020 | Lee ................... G02F 1/133305 |
| 2020/0157386 A1* | 5/2020 | Kim ..................... C08L 33/066 |
| 2021/0083231 A1 | 3/2021 | Jiang |
| 2021/0109566 A1* | 4/2021 | Myeong ................ G06F 1/1616 |
| 2021/0234106 A1 | 7/2021 | Zhu et al. |
| 2022/0006044 A1* | 1/2022 | Yan ............................ C09J 7/00 |

FOREIGN PATENT DOCUMENTS

| | | |
|---|---|---|
| CN | 206432264 U | 8/2017 |
| CN | 107665854 A | 2/2018 |
| CN | 108735785 A | 11/2018 |
| CN | 109461374 A | 3/2019 |
| CN | 109786426 A | 5/2019 |
| CN | 110192291 A | 8/2019 |
| EP | 3518283 A1 | 7/2019 |
| WO | 2019146943 A1 | 8/2019 |
| WO | 2019186990 A1 | 10/2019 |

OTHER PUBLICATIONS

Office Action dated Mar. 1, 2021, issued in counterpart to CN application No. 202010013479.8, with English Translation. (15 pages).

* cited by examiner

FLEXIBLE DISPLAY DEVICE AND METHOD FOR PREPARING THE SAME

CROSS REFERENCE TO RELATED APPLICATION

The present disclosure claims a priority of Chinese Patent Application No. 202010013479.8, filed on Jan. 3, 2020, which is incorporated herein by reference in its entirety.

TECHNICAL FIELD

The present disclosure relates to the technical field of flexible display, and in particular to a flexible display device and a method for preparing the same.

BACKGROUND

A flexible display device typically comprises a flexible display panel and a back supporting film or back protective film bound to a back surface thereof. The flexible display panel typically comprises film layer structures such as an encapsulation film layer, a light emitting film layer, a backplane film layer, and a flexible substrate. All these film layers are supported and protected by the back supporting film attached to the entire back surface of the flexible display panel. In view of the mechanical properties, the thickness of the back supporting film is generally much greater than that of the flexible display panel. Therefore, when the flexible display device is bent, the bending recovery performance, the breaking strength, the deformation capability and the like of the thickest back supporting film will directly influence the overall bending performance of the panel attached thereon.

There is a need for improving the back supporting film of the flexible display device.

SUMMARY

In one aspect, the present disclosure provides a flexible display device, comprising a flexible display panel and a back supporting film bound to a back surface of the flexible display panel, wherein the flexible display panel comprises a bonding region and a non-bonding region, wherein
the back supporting film comprises: a first base material layer bound to the flexible display panel in at least a portion of the bonding region, and a second base material layer bound to the flexible display panel in at least a portion of the non-bonding region,
wherein the first base material layer is bound to the flexible display panel via a transparent first adhesive layer, the first base material layer has a transmittance of 85% or more and a haze of 5% or less, and the first adhesive layer is a UV cured adhesive layer; and
wherein the second base material layer is bound to the flexible display panel via a second adhesive layer, wherein the second base material is different from the first base material, and the second adhesive is different from the first adhesive.

Optionally, the UV cured adhesive is a UV cured acrylic adhesive.

Optionally, the first adhesive layer has a peeling strength of 400 gram force/inch or more.

Optionally, the first adhesive has an elastic modulus greater than that of the second adhesive.

Optionally, the first adhesive has an elastic modulus of 150-500 kPa, and the second adhesive has an elastic modulus of 1-150 kPa.

Optionally, the second adhesive is a pressure-sensitive adhesive.

Optionally, the first base material is polyethylene terephthalate, and the second base material is polyimide or stainless steel.

In another aspect, the present disclosure provides a method for preparing the flexible display device as described above, comprising:
providing the flexible display panel;
forming a UV curable transparent adhesive layer on a back surface of the flexible display panel;
binding a first base material on the UV curable transparent adhesive layer,
irradiating the UV curable transparent adhesive layer with a UV light through a mask, so that the UV curable transparent adhesive layer at at least a portion of a bonding region of the flexible display panel is cured and thus adhesiveness is increased;
cutting and removing the uncured portion of the transparent adhesive layer and the first base material thereon, thereby forming the transparent first adhesive layer and the first base material layer; and
binding the second adhesive layer and the second base material layer to a non-bonding region.

Optionally, the UV curable transparent adhesive is an acrylic adhesive having a UV photoinitiator added therein.

Optionally, the UV irradiation has an irradiation energy of 2000 mJ/cm$^2$-4000 mJ/cm$^2$ and a power of 600-800 mW/cm$^2$.

Optionally, the UV curable transparent adhesive layer has a peeling strength less than 20 gram force/inch.

Optionally, the second base material layer coated with the second adhesive layer is bound to the non-bonding region by a roll laminating process.

DETAILED DESCRIPTION

With developments of flexible display screens at present, the desire for foldable display products are increasingly higher. Polyethylene terephthalate (PET) is used as a base material for the back supporting film in many flexible display devices. Both the elastic modulus and the breaking strength of the PET material are not high. This results in limited deformation resistance and resilience when it is used as a back supporting film. Unrecoverable creases are formed in conventional PET materials when they are bent at a large angle, and the unrecoverable angle after being folded in half is typically 120° or more, or in other words, differs from the angle in the initial flat position by 120° or more. Further, although the PET material has a relatively large elongation at break, there is still a risk of fracture when the bending radius is relatively small. Therefore, it is taken into account to select and use other materials with higher elastic modulus and/or breaking strength as the base material for the back supporting film attached to the entire surface.

However, the advantages of the PET base material also include good transparency, i.e., high transmittance, which is close to 90%, while having substantially no haze and black dot. This is particularly advantageous in the production of flexible substrates, because such transparent supporting films is convenient for observing electronic circuits in the bonding region of the display panel therethrough, so that the automatic optic inspection (AOI) can be successfully performed. Other materials with a high elastic modulus and/or breaking strength as described above typically have a poor transparency, and are all difficult to satisfy the requirements for clearly observing the bonding region and determining the indentation during the AOI.

Figure 1:
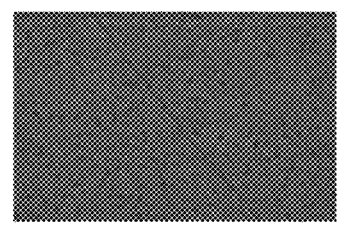
FIG. 1 shows the black dots in the back supporting film prepared from a polyimide material.

In flexible display devices, a general back supporting film is always composed of a single base material. The polyethylene terephthalate (PET) base material is advantageous for performing the AOI in the industrial production of a product, but it has insufficient deformation resistance and resilience. Other materials with high elastic modulus and/or breaking strength have poor transparency, and have more haze or black dots. FIG. 1 shows the appearance of a polyimide (PI) material with a relatively high bending resistance. As can be seen, there are a large number of black dots, which will significantly influence the AOI.

The present disclosure proposes a flexible display device in which the back supporting film comprises two different kinds of base materials in order to solve the technical problem as described above.

When attempting to provide two different kinds of base materials in the back supporting film, one kind of base material may be first bound and patterned, and then the other kind of base material may be bound. At this time, in order to satisfy the precision requirement, it is required for the patterning process to cut off the first bound base material by subtractive manufacturing. The subtractive manufacturing refers to a process for subtracting material from an integral material to obtain a final product. In the present disclosure, the subtractive manufacturing refers to a process in which an excessive amount of base material is first bound, and then unnecessary base material is removed by cutting to obtain a desired size of base material layer, rather than a process in which a base material with a proper size is prefabricated and then bound. However, if the adhesive has a high binding strength, it is difficult to remove the base material once it is bound. If the adhesive has a low binding strength, it is possible that the base material cannot be stably bound on the back surface of the display panel.

In order to solve these technical problems at the same time, the present disclosure proposes a flexible display device, comprising a flexible display panel and a back supporting film bound to a back surface of the flexible display panel, wherein the flexible display panel comprises a bonding region and a non-bonding region; wherein the back supporting film comprises: a flint base material layer bound to the flexible display panel in at least a portion of the bonding region, and a second base material layer bound to the flexible display panel in at least a portion of the non-bonding region, wherein the first base material layer is bound to the flexible display panel via a transparent first adhesive layer, the first base material layer has a transmittance of 85% or more and a haze of 5% or less, and the first adhesive layer is a UV cured adhesive layer; and wherein the second base material layer is bound to the flexible display panel via a second adhesive layer, wherein the second base material is different from the first base material, and the second adhesive is different from the first adhesive.

As described above, in existed flexible display devices, a back supporting film is always composed of a single base material in various regions of the display panel. Currently, in conventional economical materials, there are rare flexible materials with high transparency and high uniformity as well as relatively high bending resistance and relatively high resilience. Therefore, the use of single conventional base material cannot meet the performance requirements of the back supporting film for various regions. The present disclosure proposes a technical solution where the back supporting film and the adhesive layer are regionally designed for different regions of the display panel.

Further, as described above, from the viewpoint of the patterning step including subtractive manufacturing, the regionally designed technical solution raises requirements for the properties of the adhesive. In this regard, in the flexible display device of the present disclosure, a UV cured adhesive layer is used as a first adhesive layer for binding the first base material to the bonding region, so that the adhesiveness of the adhesive layer can be changed during the preparation. Specifically, the first base material layer may be first bound with a UV curable adhesive layer and then patterned by subtractive manufacturing, and finally the UV curable adhesive layer may be cured with a UV light. This can be advantageous for the subtractive manufacturing, and can also achieve high adhesiveness. In the flexible display device, the requirement for the adhesiveness of the back supporting film in the bonding region is higher than in the non-bonding region. Therefore, in the present disclosure, the UV cured adhesive layer is provided in the bonding region for the first base material, which can meet the requirement for the high adhesiveness in the bonding region at the same time. In other words, the regionally designed technical solution of the present disclosure also takes the adhesive into account. Accordingly, during the preparation, the first base material layer will be first formed.

In the present disclosure, different materials are used for the first base material and the second base material, so that different desired properties can be provided in different regions. A transparent material having a transmittance of 85% or more and a haze of 5% or less is used for the first base material layer. The first base material layer has a good transparency and a low haze, and therefore can be used for the AOI in the bonding region of the display panel, and can completely meet the requirements for clearly observing the bonding region and determining the indentation during the AOI. Of course, as the base material for the back supporting film of the flexible display device, the first base material layer also needs to have sufficient flexibility, appropriate bending resistance and resilience. Nevertheless, since the first base material layer is completely or mainly provided in the bonding region which requires relatively low bending resistance, and the bonding region is typically located at the frame of the flexible display device, insufficient bending resistance and resilience of the first base material layer substantially have no adverse effect on the display area of the flexible display device. Preferably, the first base material has a glass transition temperature Tg of 150° C. or higher, so that it can withstand the temperature of the thermal treatment in processes for the bonding region.

The second base material is different from the first base material. The properties of the second base material should meet the requirements in the non-bonding region as much as possible. The second base material should provide sufficient flexibility, good bending resistance and resilience. The bending resistance and resilience are overall properties influenced by factors such as the material, the microstructure and the size of the base material layer, and are difficult to be defined by a single physical parameter. In an embodiment, the second base material may have higher elastic modulus and/or breaking strength higher than the first base material. When the base material layer has higher elastic modulus and/or breaking strength, the bending resistance and resilience are typically better. The second base material may have much higher elastic modulus and/or breaking strength much higher than the first base material or close to the first base material. Further, in the present disclosure, one or both of elastic modulus and breaking strength of the second base material may be even lower than the first base material, as long as the bending resistance and resilience of the second base material layer in the non-bonding region are better than the first base material layer. For example, the second base material layer can also achieve better bending resistance and resilience by having different thickness or microstructure from the first base material layer. Nevertheless, it is typically preferred that the second base material has an elastic modulus and/or a breaking strength higher than the first base material.

In an embodiment, the second base material has an elastic modulus and/or a breaking strength close to the first base material. In an embodiment, the first base material has an elastic modulus in a range from 2 GPa to 6 GPa and a breaking strength in a range from 100 MPa to 400 MPa, preferably has an elastic modulus in a range from 2 to 4 GPa and a breaking strength in a range from 100 to 300 MPa; and the second base material has an elastic modulus in a range from 2 GPa to 10 GPa, and a breaking strength in a range from 100 MPa to 400 MPa, such as in a range from 140 to 400 M, such as in a range from 140 MPa to 200 MPa. In an embodiment, the first base material is PET, and the second base material is PI.

In an embodiment, the second base material has an elastic modulus and a breaking strength much higher than the first base material. In an embodiment, the first base material has an elastic modulus in a range from 2 GPa to 6 GPa and a breaking strength in a range from 100 MPa to 400 MPa, preferably has an elastic modulus in a range from 2 to 4 GPa and a breaking strength in a range from 100 to 300 MPa; and the second base material has an elastic modulus in a range from 150 GPa to 300 GPa, and a breaking strength of 1400 MPa or more, such as in a range from 1500 MPa to 2000 MPa. In an embodiment, the first base material is PET, and the second base material is stainless steel (SUS).

In an embodiment, the second base material layer has an unrecoverable angle after being folded in half of 60° or less. The unrecoverable angle after being folded in half refers to an angle measured as follows. A film-like material sample is positioned on a horizontal plane, and folded in half, so that an upper surface on one side of the crease is turned over and contacted with an upper surface on the other side of the crease. Subsequently, the external force is withdrawn, so that the folded side rebounds. After the rebounding, an angle between the folded side and its initial horizontal position is considered as the unrecoverable angle after being folded in half. In this case, as compared with a PET material with an unrecoverable angle after being folded in half of 120 or more, the second base material layer of the present disclosure has much higher bending resistance and resilience. In addition, the second base material layer may have a transmittance of less than 85% and a haze of more than 5%. Since the second base material layer is completely or mainly disposed in the non-bonding region which does not require transparency at all, it may be translucent or opaque. This is an important advantage of the present disclosure, because it significantly expands the choices of the second base material. In addition, since the second base material does not need to be capable of withstanding the temperature of the thermal treatment in the bonding region process, the glass transition temperature Tg thereof does not need to be 150° C. or higher. For example, 60° C. or higher may be sufficient. This is also an important advantage of the present disclosure, because it also significantly expands the choices of the second base material.

The display panel of the present disclosure refers to a display device which has not yet been bound to a back supporting film. Generally, it may comprise film layer structures such as an encapsulation film layer, a light emitting film layer, a backplane film layer, and a flexible substrate, and may comprise a bonding region and a non-bonding region. In the present disclosure, conventional flexible display panels to be bound to a back supporting film may be used.

Thus, the present disclosure proposes a flexible display device, in which a base material for a back supporting film on at least a portion of a bonding region is a first base material, and a portion or all of a base material for the back supporting film on a non-bonding region is a second base material. The first base material is different from the second base material. In the transverse direction (that is a direction in parallel to the flexible display panel), there may be a gap between the first base material and the second base material. The gap is located in the bonding region and may be used for folding the bonding region to narrow the frame. The first base material and the second base material may be disposed in the same layer. Such a back supporting film can have both excellent bending resistance and resilience in the non-bonding region and high transparency and low haze in the bonding region to fit the AOI.

As described above, in addition to a transmittance of 85% or more and a haze of 5% or less, the first base material should also have appropriate bending resistance and resilience. Furthermore, the first base material should have sufficient glass transition temperature to withstand the temperature of the thermal treatment in the bonding region. Since the requirements for the bending resistance and the resilience are not very high, the first base material may have the following properties: an elastic modulus in a range from 2 GPa to 6 GPa, and a breaking strength in a range from 100 MPa to 400 MPa, preferably an elastic modulus in a range from 2 to 4 GPa and a breaking strength in a range from 100 to 300 MPa; and an elongation at break of 60%-80%. Preferably, the first base material is PET. PET has a high transmittance, close to 90%. Meanwhile, this base material has good quality and very low haze; substantially has no black dot; has a glass transition temperature of 150° C. or higher; and it is inexpensive. Therefore, PET is suitable for processes such as bonding. Furthermore, PET has an elastic modulus substantially in a range from 2 to 4 GPa, typically around 2 GPa, and a breaking strength of around 115 MPa. It can meet the basic requirements for a back supporting film.

The second base material is mainly selected from materials with high bending resistance and good resilience. The requirements for transmittance and haze can be relatively relaxed, and even the second base material may be further selected from opaque materials. Furthermore, the requirement for glass transition temperature for the second base material is also relatively low, and generally, the glass transition temperature only needs to be 60° C. or higher. Available materials comprise polymer base materials. Polymer base materials may have the following properties: an elastic modulus in a range of 2 GPa to 10 GPa, such as in a range of 3 to 7 GPa; a breaking strength in a range of 100 MPa to 400 MPa, such as in a range of 140 to 400 MPa, such as in a range of 140 MPa to 200 MPa, for example ≥170 MPa; an elongation at break of 5%-40%, preferably 10%-30%; a moisture absorption of 2% or less, preferably less than 1%; no requirements for transmittance, haze and black dot. Although the second base material will also be curved after being bent, and will also have unrecoverable crease, the unrecoverable angle after being folded in half thereof may be 60° or less. A preferred polymer material is polyimide. Available materials also comprise metal base materials. Metal base materials may have the following properties: an elastic modulus in a range of 150 GPa to 300 GPa; a breaking strength of 1400 MPa or more, such as in a range of 1500 MPa to 2000 MPa; an elongation at break of 30% or less; no requirements for transmittance, haze and black dot. A preferred metal material is SUS. The unrecoverable angle after being folded in half thereof may be 60° or less. The second base material can provide excellent mechanical support and protection for the non-bonding region of the display panel.

All kinds of base materials must have sufficient bending resistance, and preferably can meet the requirement for 100K R5 dynamic bending. Meeting the requirement for 100K R5 dynamic bending means that the material will not break after repeated bending for 100000 (100K) times at a bending radius of 5 mm.

The first base material layer the second base material layer may have the same thickness. In this case, the adhesive layers also have the same thickness, so that the surfaces of the base materials for the back supporting film are positioned in the same plane. Nevertheless, the first base material layer may also have a thickness different from that of the second base material layer, and accordingly the adhesive layers also have different thicknesses, making sure that the surfaces of the base materials are positioned in the same plane. Typically, the first base material layer and the second base material layer may have a thickness of 20 μm-80 μm.

The base material layers are bound to the back surface of the flexible display panel via adhesive layers. In the present disclosure, the adhesive layer between the first base material layer and the flexible display panel is referred to as a first adhesive layer, and the adhesive layer between the second base material layer and the flexible display panel is referred to as a second adhesive layer. Different adhesives are used for the first adhesive layer and the second adhesive layer.

The first adhesive layer is a UV cured adhesive layer. The UV cured adhesive layer has high adhesiveness, which is suitable for the requirement for binding the bonding region. Meanwhile, the adhesiveness thereof can be changed during the preparation, which is suitable for the requirement for patterning the base material layer by subtractive manufacturing. Preferably, the UV cured adhesive is a UV cured acrylic adhesive. These UV cured adhesives have sufficient transparency, and thus will not impede the AOI in the bonding region. They have moderate initial adhesiveness, and thus not only can fix the first base material, but also can be easily removed in subsequent removal process. The adhesiveness is greatly increased after UV irradiation, which meet the requirement for adhesiveness for the bonding region. Preferably, the first adhesive layer may have a peeling strength up to 400 gram force/inch or more, so as to provide excellent precise adhesion for the bonding region. The peeling strength is measured by a 180° peeling test.

The second adhesive layer is different from the first adhesive layer. The second adhesive layer is located in the non-bonding region, and therefore does not need to have so good precise adhesion as the first adhesive layer. The second adhesive layer is used for the non-bonding region, and will not influence the AOI. Therefore, it does not need to be transparent. Preferably, the second adhesive is not a transparent adhesive, which significantly expands the choices of the second adhesive. Furthermore, since the requirement for positioning accuracy for the second base material layer in the non-bonding region is relatively low, the second base material layer may be formed without using subtractive manufacturing. Therefore, the second adhesive layer does not need to be a UV cured adhesive layer.

In the bonding region, the requirement for precise adhesion of the adhesive is relatively high. Therefore, preferably, the first adhesive has an elastic modulus greater than that of the second adhesive. Preferably, the first adhesive may have an elastic modulus of 150-500 kPa, and the second adhesive may have an elastic modulus of 1-150 kPa. Typically, the first adhesive layer and the second adhesive layer may have a thickness of 10 μm-50 μm.

Preferably, the second adhesive may be a pressure-sensitive adhesive. The pressure-sensitive adhesive is advantageous for binding the back supporting film to the display panel. Preferred peeling strength of the second adhesive is 400 gram force/inch or more. The second adhesive may also be an acrylic adhesive.

At least a portion of the bonding region is bound with the first base material layer, and at least a portion of the non-bonding region is bound with the second base material layer. That is, the bonding region needs to have a portion overlapped with the first base material layer, and the non-bonding region needs to have a portion overlapped with the second base material layer. In general, in the flexible display device of the present disclosure, the first base material layer is used for the bonding region, and the second base material layer is used for the non-bonding region. Nevertheless, there may also be a minor amount of the first base material in the non-bonding region, and there may also be a minor amount of the second base material in the bonding region, as long as the spirit of the present disclosure is satisfied. For example, an orthographic projection of the first base material layer on the display panel may have a portion in the non-bonding region, and an orthographic projection of the second base material layer on the display panel may have a portion in the bonding region.

There may be a gap between the first base material layer and the second base material layer, and a projection of the gap on the display panel is in the bonding region, so that the bonding region can be folded to narrow the frame.

Preferably, the entirety of the non-bonding region of the display panel is bound with the second base material layer. As such, display panel in the non-bonding region is supported and protected by the back supporting film with high bending resistance and high resilience. The back surface of the display panel in the bonding region has a portion without the back supporting film to facilitate the narrowing of the frame, and also has a highly transparent back supporting film to facilitate the AOI.

The patterns of the first and second adhesive layers may be completely different from those of the first and second base material layers respectively.

Figure 2:
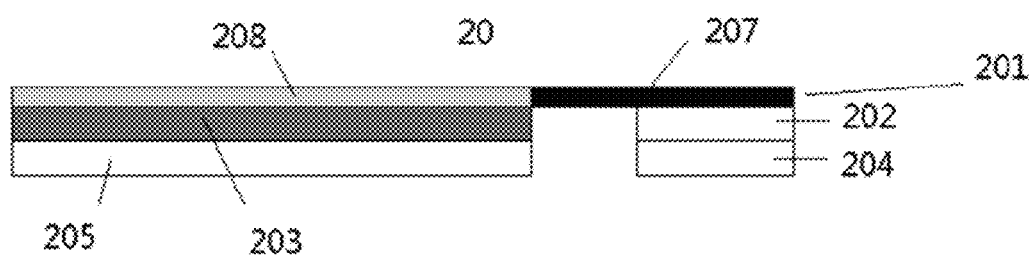
FIG. 2 shows an exemplary embodiment of a flexible display device according to the present disclosure.

FIG. 2 further illustrates the display device of the present disclosure.

FIG. 2 shows an exemplary embodiment of a flexible display device according to the present disclosure.

The flexible display device comprises a flexible display panel (201) and a back supporting film bound to a back surface of the flexible display panel, the flexible display panel (201) comprising a bonding region (207) and a non-bonding region (208); wherein the back supporting film comprises: a first base material layer (204) bound to the flexible display panel (201) in at least a portion of the bonding region (207), and a second base material layer (205) bound to the flexible display panel (201) in at least a portion of the non-bonding region (208), wherein the first base material layer (204) is bound to the flexible display panel (201) via a transparent first adhesive layer (202), the first base material layer (204) has a transmittance of 85% or more and a haze of 5% or less, and the first adhesive layer (202) is a UV cured adhesive layer; and wherein the second base material layer (205) is bound to the flexible display panel via a second adhesive layer (203), wherein the second base material is different from the first base material, and the second adhesive is different from the first adhesive.

The first adhesive layer is a UV cured transparent adhesive. The second adhesive may be a pressure-sensitive adhesive.

The flexible display device of the present disclosure may be prepared accurately by the method of the present disclosure. The preparation method according to the present disclosure comprises:

providing the flexible display panel;

forming a UV curable transparent adhesive layer on a back surface of the flexible display panel;

binding a first base material on the UV curable transparent adhesive layer, irradiating the UV curable transparent adhesive layer with a UV light through a mask, so that the UV curable transparent adhesive layer at at least a portion of a bonding region of the flexible display panel is cured and thus adhesiveness is increased;

cutting and removing the uncured portion of the transparent adhesive layer and the first base material thereon, thereby forming the transparent first adhesive layer and the first base material layer; and binding the second adhesive layer and the second base material layer to a non-bonding region.

The method of the present disclosure solves the contradiction between the requirement for low adhesiveness during the removal process and the requirement for high adhesiveness in the final product by changing the adhesiveness of the first adhesive during the binding of the first base material, and thus can be used for accurately preparing a flexible display device including two kinds of base materials. Further, the elastic modulus of the adhesive in the bonding region after being cured with UV light can be significantly increased, and thus can meet the requirement for precise adhesive for the bonding region.

Preferably, the UV irradiation applied to the UV curable transparent adhesive layer in the bonding region may have an irradiation energy 2000 mJ/cm$^2$-4000 mJ/cm$^2$, and a power of 600-800 mW/cm$^2$. Such parameters for irradiation can allow the first adhesive to be fully cured and tackified, and will not damage the base material layer. A UV photosensitizer may also be added to the UV curable transparent adhesive layer. In an embodiment, the peeling strength may be increased from less than 20 gram force/inch, such as 2 gram force/inch, to 400 gram force/inch or more. The peeling strength before irradiation of less than 20 gram force/inch, preferably less than 10 gram force/inch, is advantageous for removing uncured transparent adhesive layer and the first base material layer thereon.

In the present disclosure, an adhering process may be used. That is, the first base material layer is removed by adhering it with a stronger adhesive, and the uncured transparent adhesive layer is taken away together. It is possible to adhere a length of conventional adhesive tape on the surface of the first base material layer in a region where the adhesive is uncured, and then peeling off the first base material by pulling the adhesive tape. Since typical adhesive tape has an adhesive power to the first base material much higher than the adhesive power of the uncured transparent adhesive to the flexible display panel, the first base material and the uncured transparent adhesive layer can be easily removed. It is also possible to use a roller with an adhesive tape to stick one corner of the first base material up, then to lift up or peel off the other portion of the first base material by holding the lifted corner and applying a force.

Preferably, the second base material layer coated with the second adhesive layer is bound to the non-bonding region by a roll laminating process. The process is convenient and efficient, and is sufficient to provide accurate positioning for the second base material layer.

The method for preparing the display device according to the present disclosure will be described below with reference to FIG. 3.

As shown in FIG. 3a, a first base material layer (204) and a UV curable transparent adhesive layer (202) are provided on a carrier film (210), wherein the materials for the first base material layer and the UV curable transparent adhesive layer may be PET and an acrylic adhesive having a UV photoinitiator added therein respectively. Subsequently, as shown in FIG. 3b, the back surface of a flexible display panel (201) is bound on the adhesive layer (202). The flexible display panel (201) comprises a bonding region (207) and a non-bonding region (208). The front surface of the flexible display panel is provided with a protective film (209).

Figure 3:
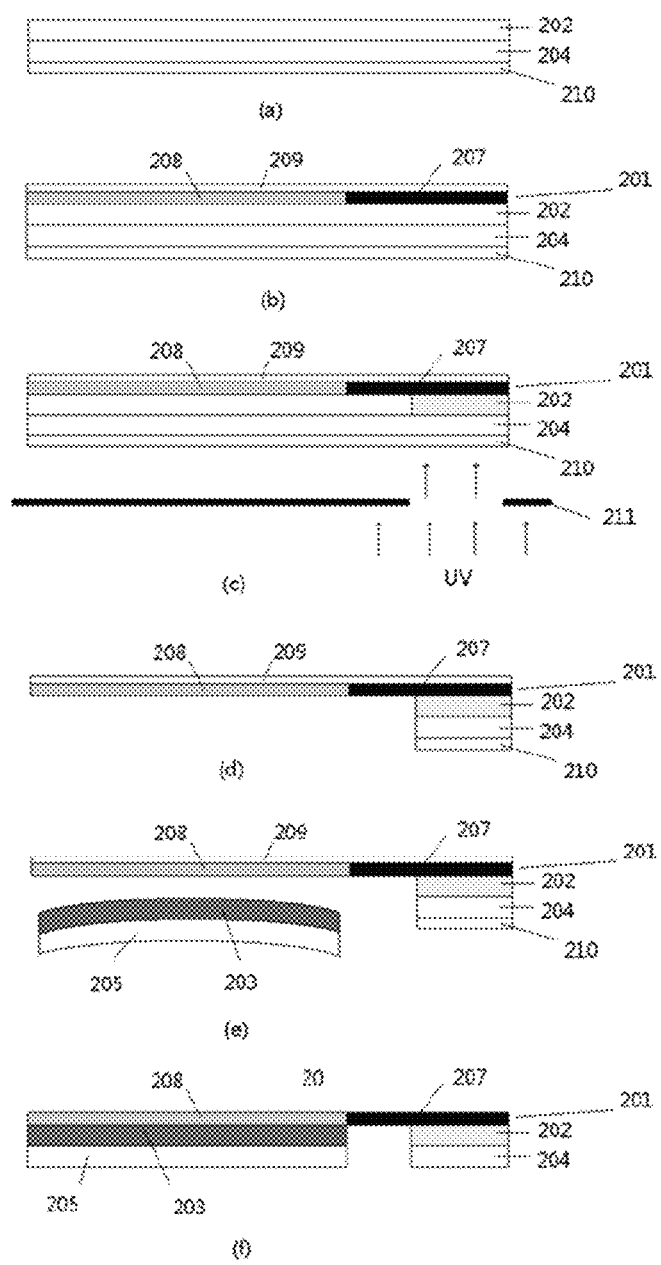
FIG. 3 shows a flow process for an embodiment of the preparation of the flexible display device according to the present disclosure.

FIG. 3 schematically shows an embodiment where there is only one display panel. Nevertheless, the carrier film may have a large area, and may be manufactured on a large scale. Multiple pieces of base material may be provided on the carrier film, and the first base material and the second base material are alternately positioned, so that it is possible to prepare multiple pieces of back supporting films once, then disposing multiple pieces of display panels, and obtain individual display panels by cutting in subsequent process.

Subsequently, the UV curable transparent adhesive layer in the bonding region is irradiated through a mask (211) for tackifying, forming a tackified region (represented by grey color in the figure) in the adhesive layer (202). Here, suitable UV irradiation process may be used, for example, directly irradiating with light, or adding a UV lamp to the table of the laminator after turning over. The UV light may have an irradiation energy of 2000 mJ/cm$^2$-4000 mJ/cm$^2$, and a power of 600-800 mW/cm$^2$. After irradiation, the peeling strength is increased from, for example, 2 gram force/inch to, for example, 400 gram force/inch or more.

Subsequently, a cutting is performed along the border of the pattern of the cured transparent adhesive layer by a semi-cutting process, that is, a process where only the base material layer and the adhesive layer are cut off without damaging the flexible display panel, and then the uncured adhesive and the first base material thereon are removed by peeling off with an adhesive tape or peeling off with a roller having an adhesive tape, to obtain the first adhesive layer (202) and the first base material layer (204) covering at least a portion of the bonding region (207) as shown in FIG. 3d.

Subsequently, a second base material (205) such as polyimide or SUS and a pressure-sensitive adhesive (203) with high adhesiveness are together bound to the non-bonding region by means of an integrated structure thereof. To this end, the pressure-sensitive adhesive is pre-coated on the second base material (205).

Finally, the protective film (209) on the front surface of the display panel and the carrier film (210) on the surface of the first base material are removed to obtain the flexible display device of the present disclosure.

The present disclosure will be further described below with reference to the following example.

Example: The Preparation of the Flexible Display Device

The flexible display device was prepared according to the process as shown in FIG. 3.

A PET bottom film was used as a carrier film, and a first base material layer was provided thereon. The first base material layer as a PET film with a thickness of 50 μm, which was obtained by injection stretching polyethylene terephthalate. A UV curable transparent adhesive layer was provided on the PET. The UV curable transparent adhesive layer was an acrylic adhesive having a UV photoinitiator added therein, and had a coating thickness of 15 μm. The acrylic adhesive was obtained by mixing an acrylate prepolymer and an active diluent monomer, and a UJV photoinitiator derived from IR651 or the like was added therein. The UV photoinitiator constituted about 3% of the total weight. The UV curable transparent adhesive layer had a peeling strength of about 4 gram force/inch when it had not been cured. Subsequently, the back surface of a flexible display panel was bound to the UV curable transparent adhesive layer. The material of the back surface of the flexible display panel was polyimide. The front surface of the flexible display panel was provided with a protective film. A portion of the bonding region of the flexible display panel was irradiated with UV light through a mask. The UV irradiation had an irradiation energy of 3500 mJ/cm$^2$ and a power of 650 mW/cm$^2$. Under the action of UV light, the UV curable transparent adhesive layer was converted to a UV cured adhesive layer, with a peeling strength of about 440 gram force/inch and an elastic modulus of about 300 kPa. A cutting was performed along the border of the pattern of the cured transparent adhesive layer by a semi-cutting process, that is, a process where only the base material layer and the adhesive layer were cut off without damaging the flexible display panel, and then the uncured adhesive and the first base material thereon were removed by sticking one corner up with a roller having an adhesive tape and then peeling off, to re-expose the back surface of the flexible display panel, wherein the adhesive tape in the peeling off with the roller having an adhesive tape was a commercially available double face adhesive tape with high adhesiveness. A second base material layer and a second adhesive were together bound to the non-bonding region on the back surface of the flexible display panel, wherein the second base material was a polyimide film pre-coated with the second adhesive and had a thickness of 40 μm, and the second adhesive was a polyacrylate adhesive. The second adhesive had an elastic modulus of about 50 kPa. Finally, the protective film and the remaining carrier film were removed to obtain the flexible display device.

AOI can be successfully performed on the flexible display device prepared, and the flexible display device had good bending resistance and resilience in the non-bonding region or in the display area. Also, it had excellent adhesiveness in the bonding region, and the back supporting film was accurately disposed in a desired position of the flexible display panel.

Obviously, modifications and variations on the embodiments of the present disclosure can be made by those skilled in the art without departing from the spirit and scope of the present application. As such, if these modifications and variations fall within the scopes of the claims of the present application or equivalents thereof, the present application is intended to encompass these modifications and variations.

The invention claimed is:

1. A flexible display device, comprising a flexible display panel and a back supporting film bound to a back surface of the flexible display panel, wherein the flexible display panel comprises a bonding region and a non-bonding region, wherein
the back supporting film comprises: a layer of a first base material bound to the flexible display panel in at least a portion of the bonding region, and a layer of a second base material bound to the flexible display panel in at least a portion of the non-bonding region,
wherein the layer of the first base material is bound to the flexible display panel via a layer of a transparent first adhesive, the layer of the first base material has a transmittance of 85% or more and a haze of 5% or less, and the layer of the first adhesive layer is a layer of a UV cured adhesive; and
wherein the layer of the second base material is bound to the flexible display panel via a layer of a second adhesive, wherein the second base material is different from the first base material, and the second adhesive is different from the first adhesive,
wherein the first adhesive has an elastic modulus greater than that of the second adhesive, the first adhesive has an elastic modulus of 150-500 kPa, and the second adhesive has an elastic modulus of 1-150 kPa.

2. The flexible display device according to claim 1, wherein,
the UV cured adhesive is a UV cured acrylic adhesive.

3. The flexible display device according to claim 1, wherein,
the layer of the first adhesive has a peeling strength of 400 gram force/inch or more.

4. The flexible display device according to claim 1, wherein,
the second adhesive is a pressure-sensitive adhesive.

5. The flexible display device according to claim 1, wherein,
the first base material is polyethylene terephthalate, and the second base material is polyimide or stainless steel.

6. A method for preparing the flexible display device of claim 1, comprising:
providing the flexible display panel;
forming a UV curable transparent adhesive layer on a back surface of the flexible display panel;
binding a first base material on the UV curable transparent adhesive layer;
irradiating the UV curable transparent adhesive layer with a UV light through a mask, so that the UV curable transparent adhesive layer at at least a portion of a bonding region of the flexible display panel is cured and thus adhesiveness is increased;

cutting and removing the uncured portion of the transparent adhesive layer and the first base material thereon, thereby forming the transparent first adhesive layer and the first base material layer; and binding the second adhesive layer and the second base material layer to a non-bonding region.

7. The method according to claim 6, wherein, the UV curable transparent adhesive is an acrylic adhesive having a UV photoinitiator added therein.

8. The method according to claim 7, wherein, the UV irradiation has an irradiation energy of 2000 mJ/cm$^2$-4000 mJ/cm$^2$ and a power of 600-800 mW/cm$^2$.

9. The method according to claim 6, wherein, the UV curable transparent adhesive layer has a peeling strength less than 20 gram force/inch.

10. The method according to claim 6, wherein, the second base material layer coated with the second adhesive layer is bound to the non-bonding region by a roll laminating process.

\* \* \* \* \*